(12) United States Patent
Kudou et al.

(10) Patent No.: US 7,829,416 B2
(45) Date of Patent: Nov. 9, 2010

(54) SILICON CARBIDE SEMICONDUCTOR DEVICE AND METHOD FOR PRODUCING THE SAME

(75) Inventors: Chiaki Kudou, Hyogo (JP); Kazuya Utsunomiya, Hyogo (JP); Masashi Hayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 90 days.

(21) Appl. No.: 12/443,210

(22) PCT Filed: Aug. 1, 2008

(86) PCT No.: PCT/JP2008/002073
§ 371 (c)(1),
(2), (4) Date: Mar. 27, 2009

(87) PCT Pub. No.: WO2009/019837
PCT Pub. Date: Feb. 12, 2009

(65) Prior Publication Data
US 2010/0075474 A1    Mar. 25, 2010

(30) Foreign Application Priority Data
Aug. 7, 2007   (JP) ............................. 2007-205204

(51) Int. Cl.
*H01L 21/336* (2006.01)
(52) U.S. Cl. .................. 438/268; 438/285; 438/931
(58) Field of Classification Search .................. 438/268, 438/285, 931
See application file for complete search history.

(56) References Cited

U.S. PATENT DOCUMENTS

| 6,200,871 | B1 | 3/2001 | Moslehi |
| 2005/0001217 | A1* | 1/2005 | Kusumoto et al. ............ 257/77 |
| 2005/0026428 | A1 | 2/2005 | Choi |
| 2005/0067661 | A1 | 3/2005 | Choi |
| 2005/0118757 | A1 | 6/2005 | Cabral, Jr. et al. |

FOREIGN PATENT DOCUMENTS

| JP | 2000-196072 | 7/2000 |
| JP | 2004-519842 | 7/2004 |
| JP | 2004-288890 | 10/2004 |
| JP | 2005-012099 | 1/2005 |
| JP | 2005-072519 | 3/2005 |
| JP | 2006-066438 | 3/2006 |
| WO | 02/29900 | 4/2002 |
| WO | 2006/014188 | 2/2006 |

OTHER PUBLICATIONS

International Search Report for corresponding Application No. PCT/JP2008/002073 mailed Oct. 28, 2008.
Form PCT/ISA/237 and a partial English translation.

* cited by examiner

*Primary Examiner*—Bradley K Smith
(74) *Attorney, Agent, or Firm*—Renner, Otto, Boisselle & Sklar, LLP

(57) ABSTRACT

A gate electrode 18 formed on a silicon carbide substrate 11 includes a silicon lower layer 18A and a silicide upper layer 18B provided on the silicon lower layer 18A, the silicide upper layer 18B being made of a compound of a first metal and silicon. A source electrode 1a*s* formed on the surface of the silicon carbide substrate 11 and in contact with an n type source region and a p+ region contains second metal silicide different from the first metal silicide. Side faces of the silicon lower layer 18A are covered with an insulator.

7 Claims, 13 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(c)

SILICON CARBIDE SEMICONDUCTOR DEVICE AND METHOD FOR PRODUCING THE SAME

TECHNICAL FIELD

The present invention relates to a semiconductor device having a silicon carbide substrate, and a method of producing the same.

BACKGROUND ART

Silicon carbide (silicon carbide: SiC) is a semiconductor material with a high hardness which has a greater band gap than that of silicon (Si), and is applied in various semiconductor devices such as power devices, environment resistant devices, high-temperature operating devices, and high-frequency devices. Among others, applications to power devices such as switching devices and rectifier devices are drawing attention. A power device in which SiC is used has an advantage of e.g. a greatly reduced power loss than that of an Si power device.

Among power devices in which SiC is used, representative switching devices are MOSFETs and MOSFETs. In such switching devices, based on a voltage which is applied to the gate electrode, it is possible to switch between an ON state where a drain current of several A (ampere) or more flows and an OFF state where there is zero drain current. Moreover, with SiC, a high breakdown voltage of several hundred V or more can be realized in the OFF state.

In such power devices, a structure is often adopted in which a current is allowed to flow in the front-rear direction of the substrate. Herein, the front face side is patterned by using a photoresist, whereas in most cases, an ohmic contact is formed on the essentially the entire surface of the rear face side.

A switching device structure using SiC is proposed in Patent Document 1, for example. Hereinafter, with reference to the drawings, the structure of a vertical MOSFET (a transistor in which a source electrode and a drain electrode are formed on opposite faces of the substrate) will be described.

FIG. 12A is a schematic cross-sectional view showing unit cells 1000 of a vertical MOSFET in which SiC is used, and FIG. 12B is a plan view showing the layout of component elements in a portion of the vertical MOSFET. FIG. 12A corresponds to a cross-sectional view as seen in the direction of arrows at line A-A' in FIG. 12B. A vertical MOSFET typically includes a plurality of unit cells. FIG. 12A and FIG. 12B shows some unit cells 1000 among them.

As shown in FIG. 12A, a unit cell 1000 of a vertical MOSFET includes: a silicon carbide epitaxial layer 120 formed on a principal face of a low-resistance n type SiC substrate 101; a channel layer 106 formed on the silicon carbide epitaxial layer 120; a gate electrode 108 provided on the channel layer 106 via a gate insulating film 107; a source electrode 109 in contact with a surface 120s of the silicon carbide epitaxial layer; and a drain electrode 110 provided on the rear face of the SiC substrate 101.

FIG. 12B shows an exemplary layout of the gate electrode 108 and the source electrodes 109. This gate electrode 108 is made of an electrically conductive film covering a principal face of the SiC substrate 101, and includes a plurality of openings. A source electrode 109 is formed in the central portion of each of the plurality of openings. In FIG. 12B, a line surrounding each source electrode 109 shows the contour of a well region 103 described later. Each unit cell 1000 in the illustrated example includes one well region 103 and one source electrode 109.

The silicon carbide epitaxial layer 120 includes well regions 103 having a different conductivity type (which herein is the p type) from the conductivity type of the SiC substrate 101, and a drift region 102 which is composed of a portion of the silicon carbide epitaxial layer 120 where the well regions 103 are not formed. The drift region 102 is an n$^-$ type silicon carbide layer containing an n type impurity at a lower concentration than in the SiC substrate 101, for example.

Inside each well region 103, an n type source region 104 containing an n type impurity at a high concentration and a p$^+$ type contact region 105 containing a p type impurity at a higher concentration than in the well region 103 are formed. The well regions 103, the source regions 104, and the contact regions 105 are formed through a step of implanting an impurity into the silicon carbide epitaxial layer 120 and a high-temperature heat treatment (activation anneal) step of activating the impurity which has been implanted into the silicon carbide epitaxial layer 120.

The source regions 104 and the drift region 102 are connected via the channel layer 106. The channel layer 106 is a 4H-SiC layer which is formed on the silicon carbide epitaxial layer 102 through epitaxial growth, for example.

Each contact region 105 and each source region 104 constitute an ohmic contact with a source electrode 109. Thus, the well region 103 is electrically connected with the source electrode 109 via the contact region 105.

The source electrodes 109 can be formed by, after forming an electrically conductive material (Ni) layer on the source regions 104 and the contact regions 105 of the silicon carbide epitaxial layer 120, performing a heat treatment at a high temperature. Generally speaking, a heat treatment at a high temperature of about 1000° C. is performed (Post Deposition Annealing technique) to obtain the source electrodes 109. According to this method, a reaction layer is formed through the high-temperature heat treatment at the interfaces between the electrically conductive material layer and the source regions 104 and the contact regions 105, and therefore the resultant source electrodes 109 have good ohmic characteristics with respect to these regions 104 and 105. More specifically, it is presumable that, when Ni is adopted as the material for the source electrode, Ni reacts with the Si within the silicon carbide to form Ni silicide, and the C within the silicon carbide is taken into the Ni silicide film, so that an impurity level that is ascribable to C is formed at the interface between Ni silicide and silicon carbide, whereby an ohmic contact is formed.

The gate insulating film 107 is a thermal oxide film (SiO$_2$ film) which is formed by subjecting the surface of the channel layer 106 to thermal oxidation, for example. The gate electrode 108 is formed by using an electrically conductive polysilicon, for example. The gate electrode 108 is common to the respective unit cells, and is connected to an external circuit via one gate electrode pad (not shown). A gate signal is to be supplied to the gate electrode 108 through this gate electrode pad.

The gate electrode 108 is covered by an interlayer insulating film 111. Openings 113 are formed in the interlayer insulating film 111, such that the source electrodes 109 of the respective unit cells are connected in parallel to an upper electrode layer (e.g. an Al electrode) 112 through the openings 113.

Ohmic characteristics are also required of the drain electrode 110. Again, Ni is adopted for the drain electrode 110;

after forming Ni on the rear face of the silicon carbide substrate 101, a heat treatment at a high temperature of about 1000° C. is performed to obtain the drain electrode 110. On the surface (corresponding to the lower side of the drain electrode 110 in FIG. 12A) of the drain electrode, a rear face electrode 130 for assembly into a package is further formed. The rear face electrode 130 has a multilayer structure in most cases.

[Patent Document 1] Japanese National Phase PCT Laid-Open Publication No. 2004-519842

DISCLOSURE OF INVENTION

Problems to be Solved by the Invention

In a MOSFET in which an SiC substrate is used, the chip area can be made smaller than in the case where Si is used, but the operating frequency will be higher.

By using an SiC substrate, the inventors produced a vertical MOSFET in which phosphorus-doped polysilicon was employed as the gate electrode 108, and observed that a delay of switching occurred at a chip end away from the gate electrode pad due to the resistance of the gate electrode. This is because, although use of SiC allows the film thickness of the drift layer formed on the SiC substrate to be thin due to its high insulation breakdown voltage, it results in an increased capacitance of the drift layer. When the capacitance of the drift layer is large, under the same sheet resistance value, there is a large influence on delay as compared to Si-MOS.

On the other hand, when the gate electrode was formed from a metal such as aluminum in order to reduce the resistance of the gate electrode, switching delay of the gate will be eliminated, but a deterioration in the reliability of the gate insulating film was observed, caused by the metal directly coming into contact with the gate insulating film.

The present invention has been made in view of the above circumstances, and an objective thereof is to reduce the resistance of a gate electrode without deteriorating the reliability of a gate insulating film.

Means for Solving the Problems

A method of producing a silicon carbide semiconductor device according to the present invention comprises the steps of: providing a silicon carbide substrate having a silicon carbide epitaxial layer formed on a surface thereof; forming a source region in the silicon carbide epitaxial layer; forming a gate insulating film on the silicon carbide epitaxial layer; forming a silicon gate electrode on the gate insulating film; covering side faces of the silicon gate electrode with an insulator; depositing a first metal which is in contact with an upper face of the silicon gate electrode; allowing a portion of the silicon gate electrode to react with the first metal to form a gate electrode having an upper layer of first metal silicide and a lower layer of silicon; removing an unreacted portion of the first metal having failed to react with the silicon gate electrode; forming an interlayer insulating film having an opening above the source region; depositing on the interlayer insulating film a second metal which is in contact with a portion of the source region via the opening; and allowing a portion of the source region to react with the second metal to form a layer of second metal silicide above the source region.

In a preferred embodiment, the step of covering the side faces of the silicon gate electrode with an insulator comprises: depositing an insulating film; and etching back the insulating film to form side wall spacers on the side faces of the silicon gate electrode, wherein, when the portion of the silicon gate electrode and the first metal are allowed to react, the portion of the first metal is in contact with the source region.

In a preferred embodiment, when the portion of the silicon gate electrode and the first metal are allowed to react, the first metal is heated at a temperature which allows silicidation to occur between the first metal and silicon but which does not allow silicidation to occur between the first metal and silicon carbide.

In a preferred embodiment, the first metal is Ti; and the temperature is in a range from 650° C. to 850° C.

In a preferred embodiment, the step of covering the side faces of the silicon gate electrode with an insulator comprises the steps of: depositing an insulating film; and exposing at least a portion of the upper face of the silicon gate electrode by removing at least part of a portion of the insulating film which is in contact with the upper face of the silicon gate electrode.

In a preferred embodiment, when the portion of the silicon gate electrode and the first metal are allowed to react, the first insulating film is present between the first metal and the source region.

In a preferred embodiment, the second metal contains Ni.

In a preferred embodiment, the first metal has a thickness which is smaller than ½ of a thickness of the silicon gate electrode.

A silicon carbide semiconductor device according to the present invention comprises: a silicon carbide substrate having a silicon carbide epitaxial layer on a surface thereof, a source region being formed in the silicon carbide epitaxial layer; a gate insulating film formed on the silicon carbide epitaxial layer; a gate electrode formed on the gate insulating film, the gate electrode having an upper layer of first metal silicide containing a first metal and a lower layer of silicon; and a layer formed on the source region, the layer being made of second metal silicide containing a second metal which is different from the first metal, wherein, side faces of the lower layer of silicon of the gate electrode are covered with an insulator.

In a preferred embodiment, the first metal silicide is a compound of Ti and Si.

In a preferred embodiment, the second metal silicide is a compound with Si containing Ni.

Effects of the Invention

With a method of producing a silicon carbide semiconductor device according to the present invention, the material which is in contact with a gate insulating film may be polysilicon or amorphous silicon, and the reliability of the gate insulating film is ensured. Since an upper portion of the gate electrode is silicidized, its resistance has a value which is about 1/10 that of polysilicon. Even if the film thickness of the SiC drift layer is made so thin that it has an increased drift capacitance, the delay in the switching operation associated with the gate resistance can still be suppressed.

Figure 1:
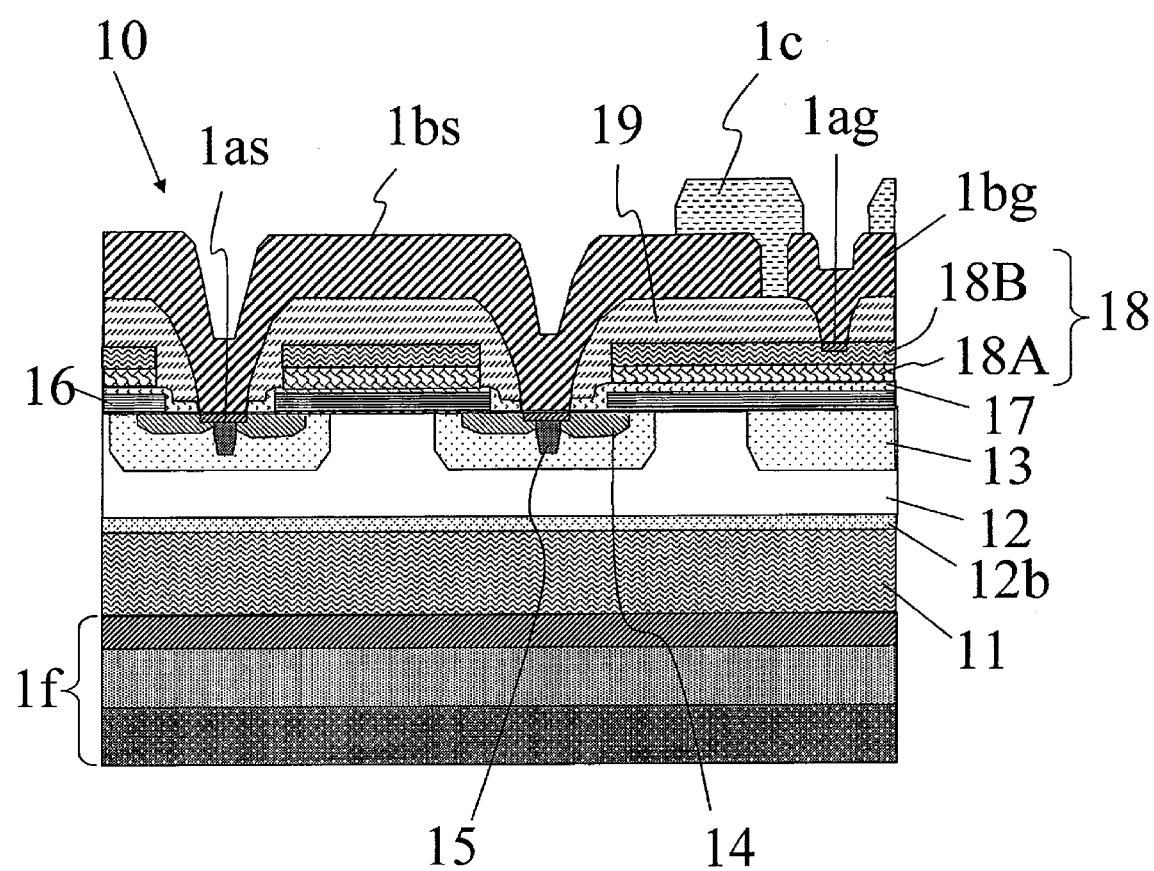
FIG. 1 A cross-sectional view of a silicon carbide semiconductor device 10 according to Embodiment 1 of the present invention.
Figure 2:
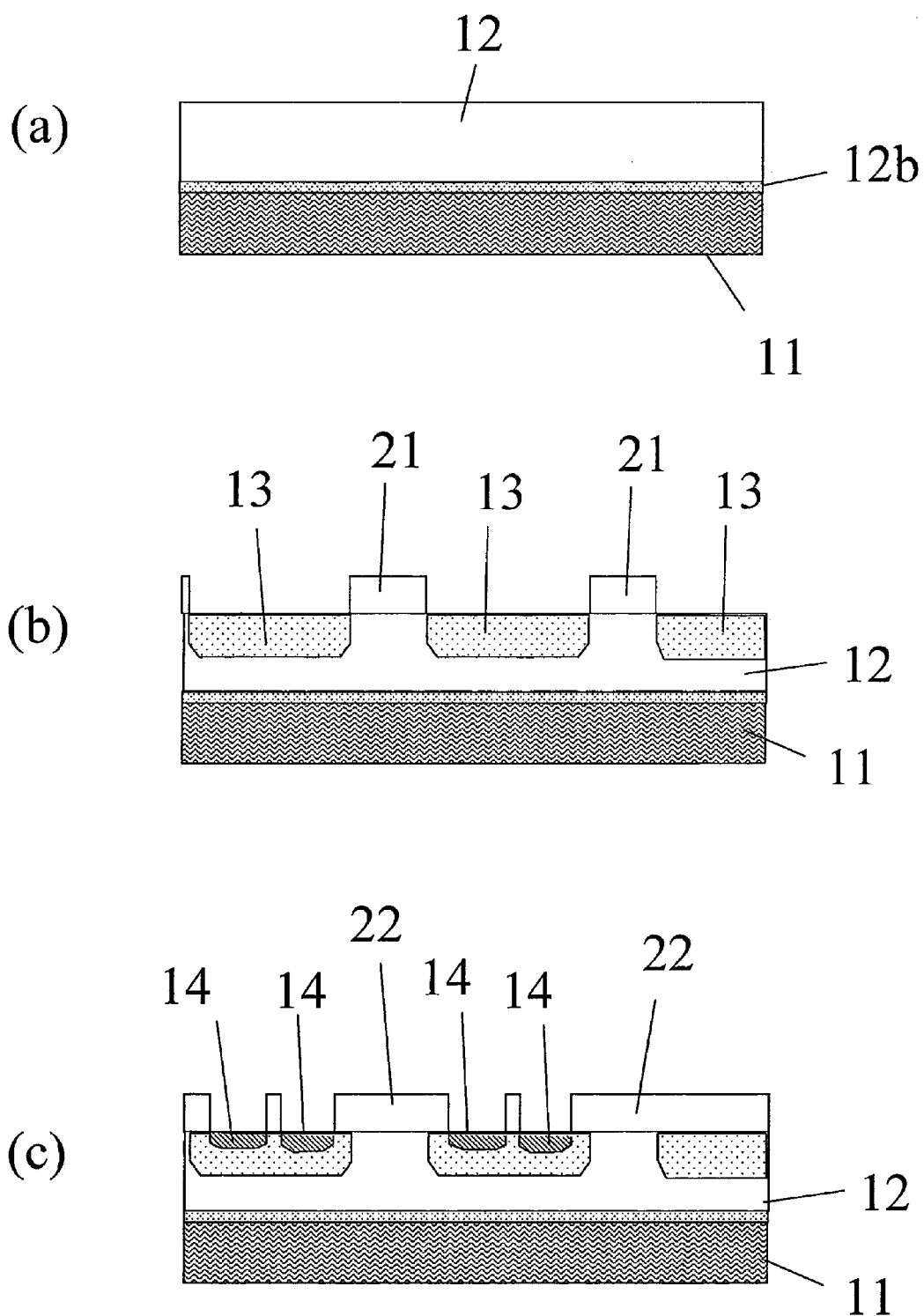
FIG. 2 (*a*) to (*c*) are cross-sectional views showing production steps of a semiconductor device according to Embodiment 2 of the present invention.
Figure 3:
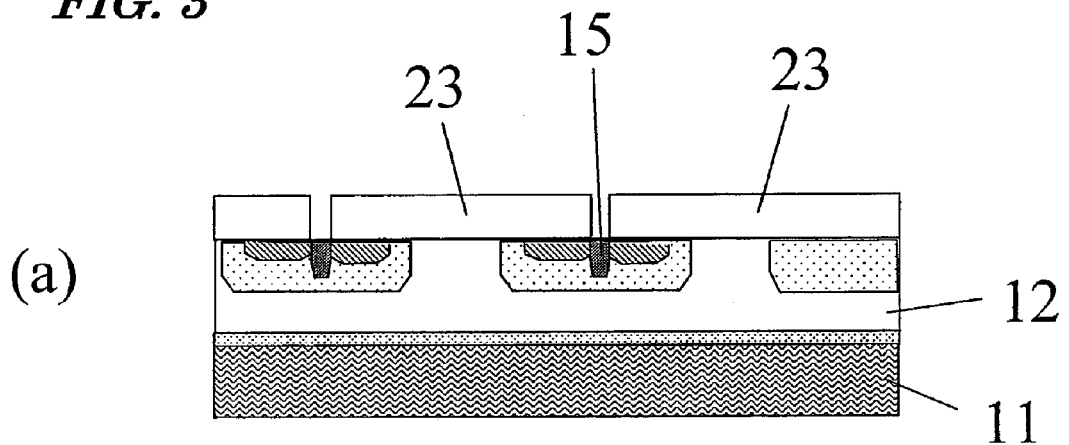
FIG. 3 (*a*) to (*c*) are cross-sectional views showing production steps of the semiconductor device according to Embodiment 2.
Figure 3:
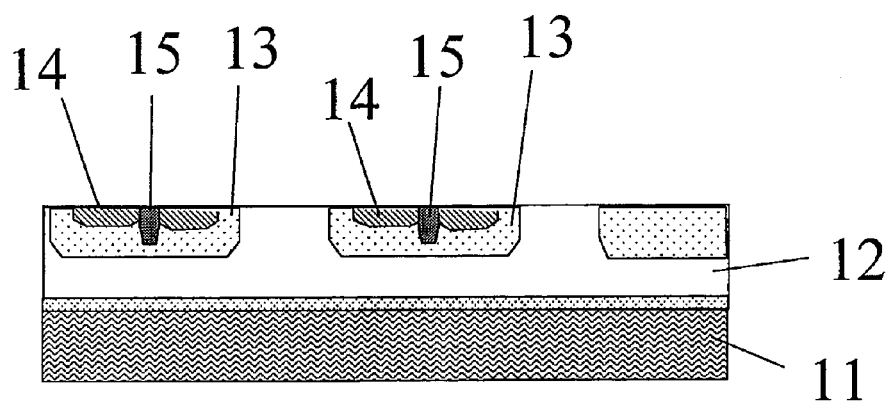
Figure 3:
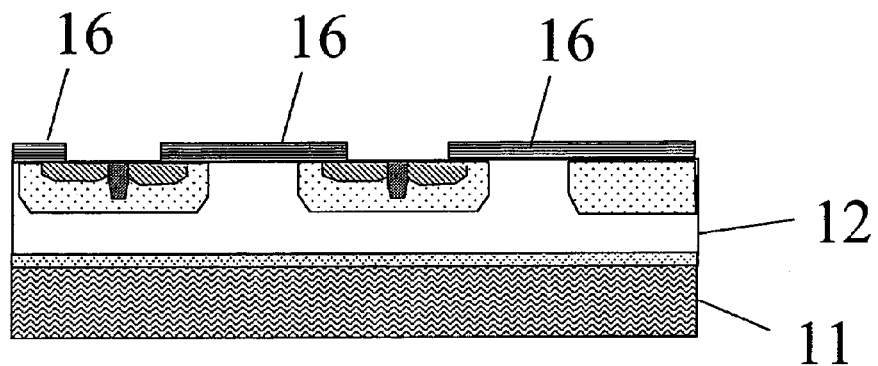
Figure 4:
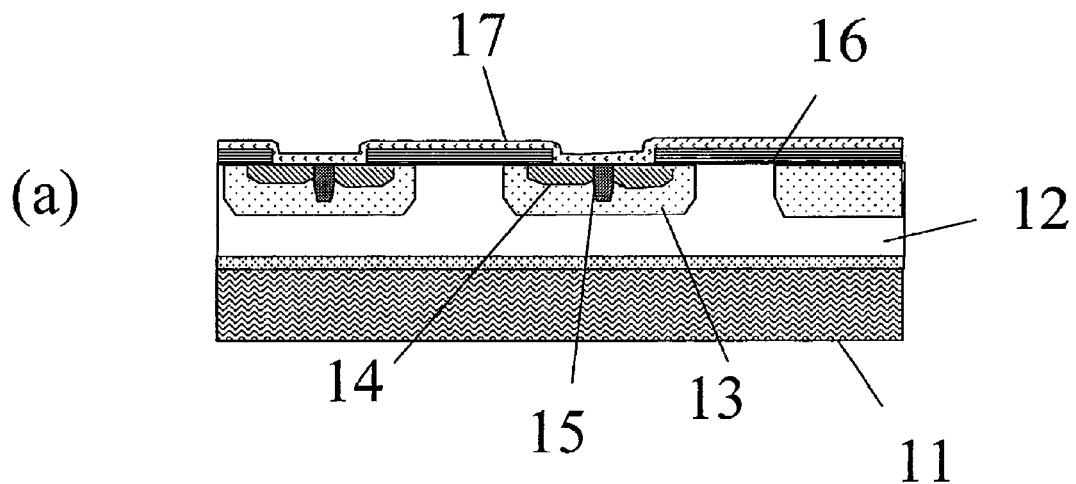
FIG. 4 (a) to (c) are cross-sectional views showing production steps of the semiconductor device according to Embodiment 2.
Figure 4:
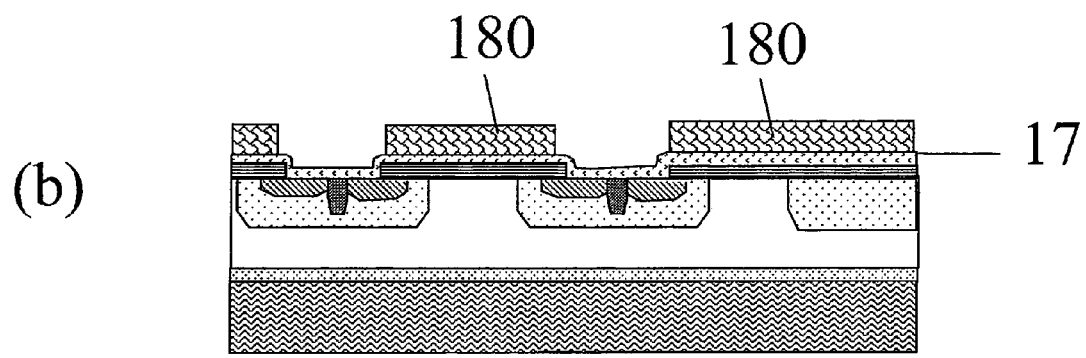
Figure 4:
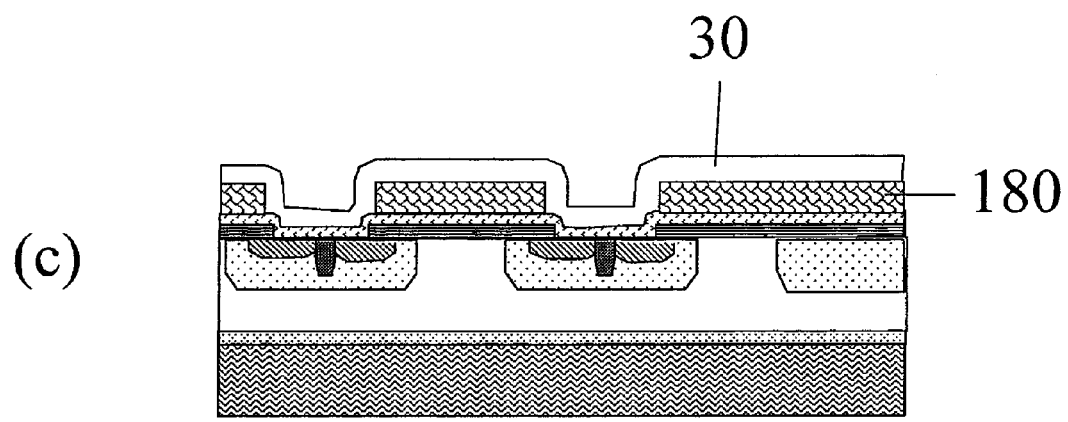
Figure 5:
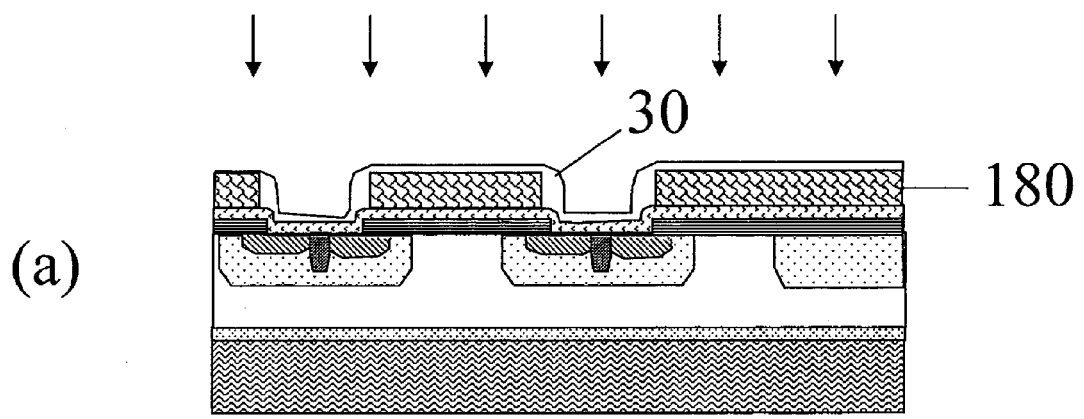
FIG. 5 (a) to (c) are cross-sectional views showing production steps of the semiconductor device according to Embodiment 2.
Figure 5:
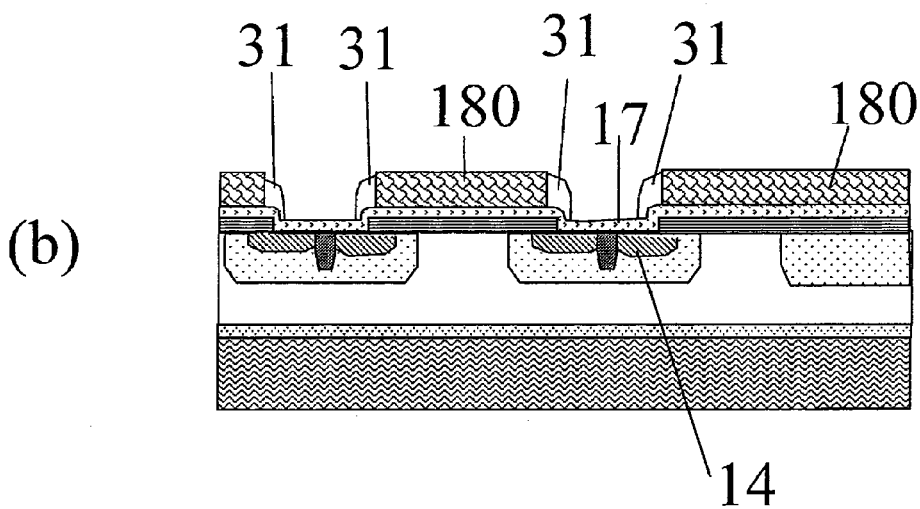
Figure 5:
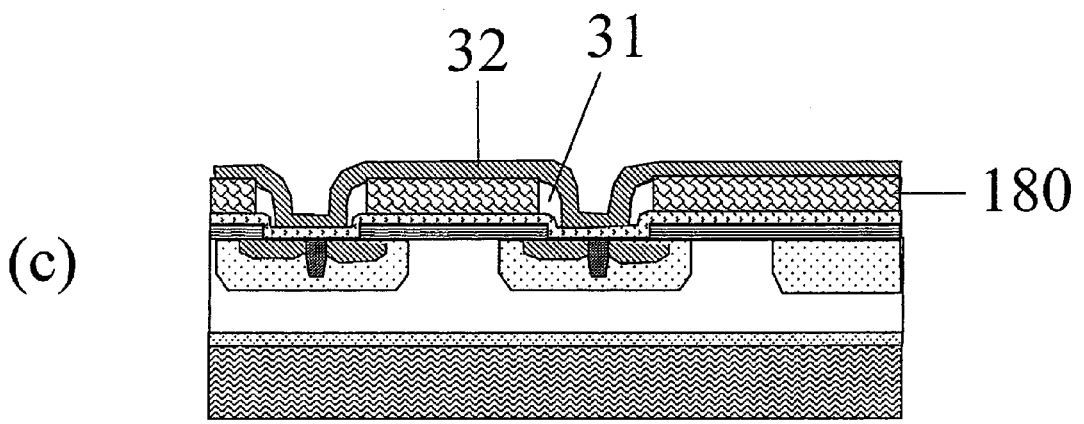
Figure 6:
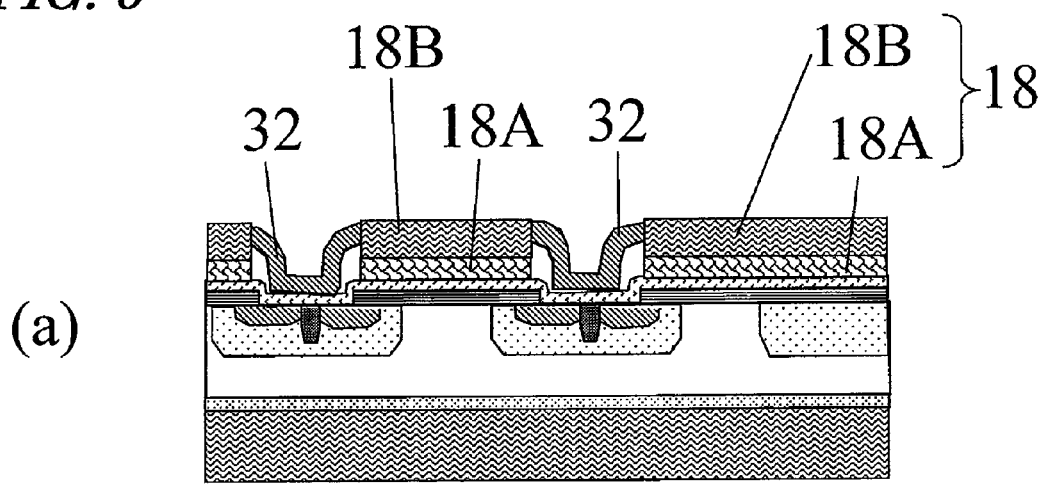
FIG. 6 (a) to (c) are cross-sectional views showing production steps of the semiconductor device according to Embodiment 2.
Figure 6:
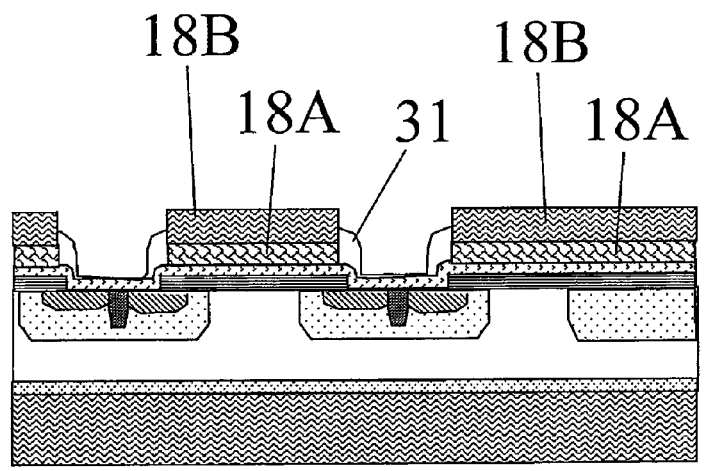
Figure 6:
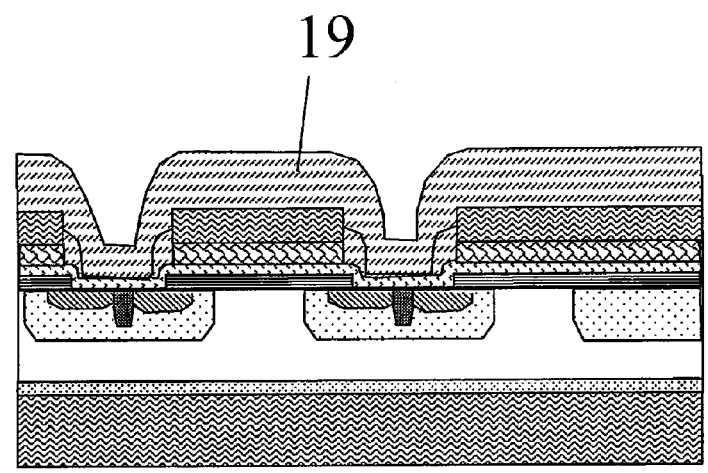

DESCRIPTION OF REFERENCE NUMERALS 10 semiconductor device (MOSFET)
11 silicon carbide substrate
12 semiconductor layer
13 p type well region
14 n type source region
15 p+ type contact implanted region
16 channel layer
17 gate insulating film
18 gate electrode
18A silicon lower layer of gate electrode
18B silicide upper layer of gate electrode
19 interlayer insulating film
21, 22 mask
23, 34 mask
30 insulating film
31 side wall spacer
32 first metal
41, 42 exposed face
1as source electrode
1ag electrode in ohmic contact with gate electrode
1bs source pad (upper wiring electrode)
1bg gate pad
1c passivation layer
1f metal electrode layer

BEST MODE FOR CARRYING OUT THE INVENTION

Embodiment 1

Hereinafter, with reference to FIG. 1, embodiments of the silicon carbide semiconductor device according to the present invention will be described.

Figure 12A:
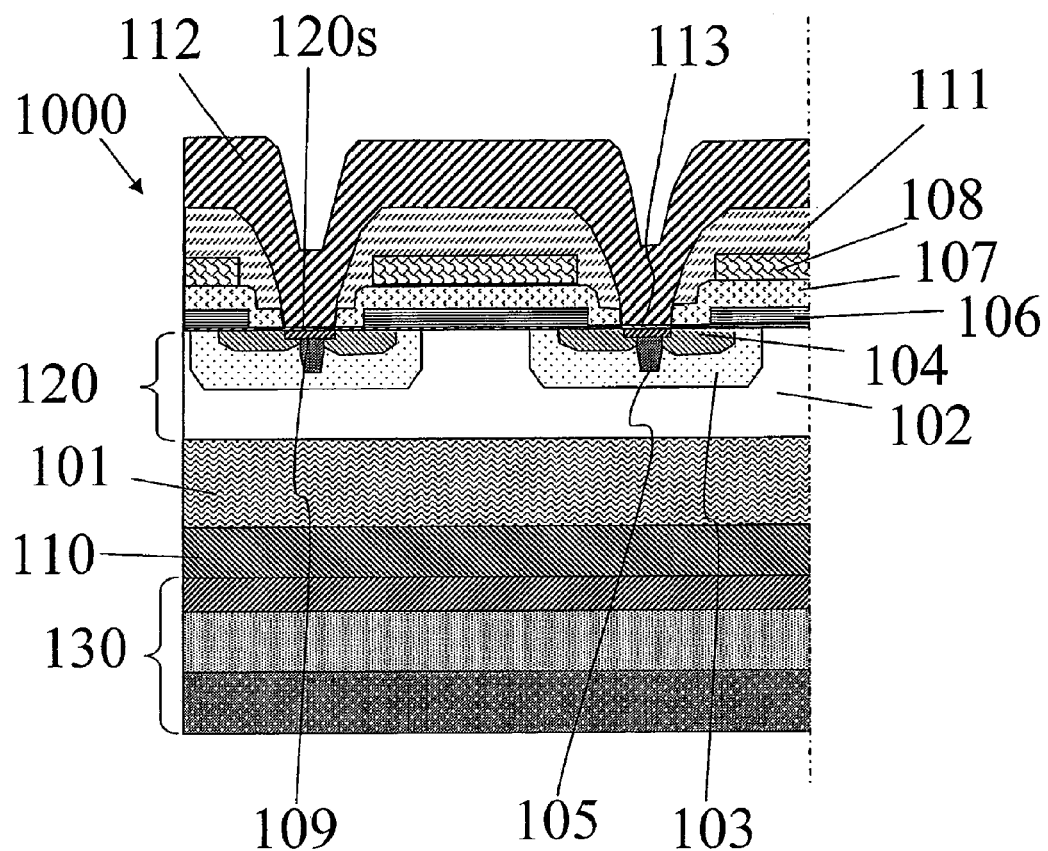
FIG. 12A A cross-sectional view showing a conventional silicon carbide semiconductor device 1000.
Figure 12B:
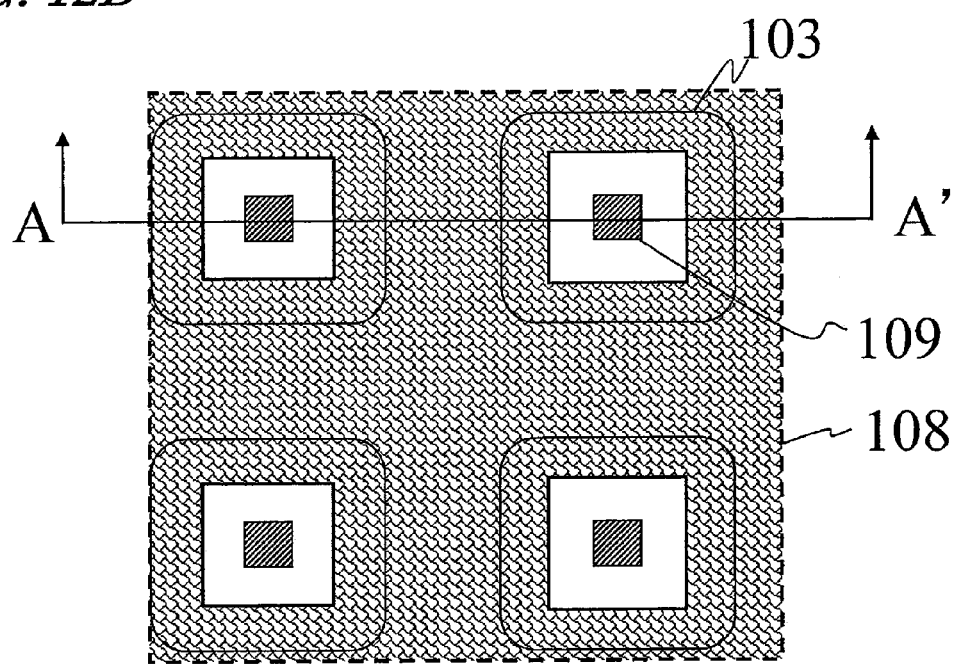
FIG. 12B A plan view showing an exemplary layout of the conventional silicon carbide semiconductor device 1000.

FIG. 1 is a cross-sectional view showing an example of a MOSFET 10 having a silicon carbide substrate. The planar layout of the MOSFET 10 is substantially similar to the planar layout shown in FIG. 12B.

A silicon carbide substrate 11 shown in FIG. 1 has a principal face which is tilted by θ degrees ($0 \leq \theta \leq 10$ degrees) from the 4H-SiC (0001) plane, for example, such that the substrate surface (principal face) is an Si-plane and the substrate rear face is a C-plane. In the present embodiment, the Si-plane on the front face side of the silicon carbide substrate 11 has a smaller surface roughness than does the C-plane on the rear face side. The silicon carbide substrate 11 has an impurity concentration of $1 \times 10^{18}$ cm$^{-3}$ or more. A semiconductor layer 12 is an n type 4H-SiC (having an impurity concentration of about $1 \times 10^{14}$ to $1 \times 10^{17}$ cm$^{-3}$ and a thickness of 5 microns or more) layer which is epitaxially grown on the silicon carbide substrate 11. A buffer 12b may be inserted between the semiconductor layer 12 and the silicon carbide substrate 11.

A p type well region 13 is a region of the semiconductor layer 12 where an aluminum is implanted, and has a depth of about 600 nm and an average concentration of about $1 \times 10^{18}$ cm$^{-3}$, for example. An n+ type source region 14 is a region of the semiconductor layer 12 where nitrogen is implanted, and has a depth about 300 nm and an average concentration of about $1 \times 10^{19}$ cm$^{-3}$. A p+ type contact implanted region 15 is a region where aluminum is implanted at a high concentration, and has a depth of about 400 nm and an average concentration of about $5 \times 10^{19}$ cm$^{-3}$. A channel layer 16, which is made of an n type silicon carbide, is an epitaxially-grown layer formed on the semiconductor layer 12, and has a film thickness of about 200 nm and an average concentration of about $1 \times 10^{17}$ cm$^{-3}$, for example. A gate insulating film 17 is formed on the channel layer 16, and has a thickness of about 70 nm, for example.

A gate electrode 18 is formed on the gate insulating film 17, and has a silicon lower layer 18A and a silicide upper layer 18B. The silicon lower layer 18A is made of silicon such as polysilicon, and has a thickness in the range from 100 nm to 1 μm, for example. The silicide upper layer 18B is made of a metal silicide, which is a compound of a high-melting point metal (e.g. Ti) and silicon, and has a thickness in the range from 50 nm to 500 nm, for example. By adopting such a construction, a sheet resistance of 3Ω/□ or less can be obtained, as opposed to a sheet resistance of about 30Ω/□ in the case where the gate electrode is made of polysilicon alone.

As described above, a portion of the gate electrode 18 that is in contact with the gate insulating film 17 is a silicon layer, such that no metal silicide is in contact with the gate insulating film 17, whereby the reliability of the gate insulating film 17 is ensured. Moreover, since the upper portion of the gate electrode 18 is silicidized, the resistance value of the gate electrode 18 can be greatly reduced as compared to a gate electrode which is entirely made of polysilicon. For example, in the case where the silicon lower layer 18A is made of polysilicon with a thickness of 300 nm and the silicide upper layer 18B is made of TiSi$_2$ with a thickness of 200 nm, the resistance value can be about 1/10 of that of a polysilicon gate electrode having a thickness of 500 nm. Therefore, even if the SiC drift layer is made so thin that it has an increased drift capacitance, the delay in the switching operation associated with the gate resistance value can still be suppressed.

Figure 13:
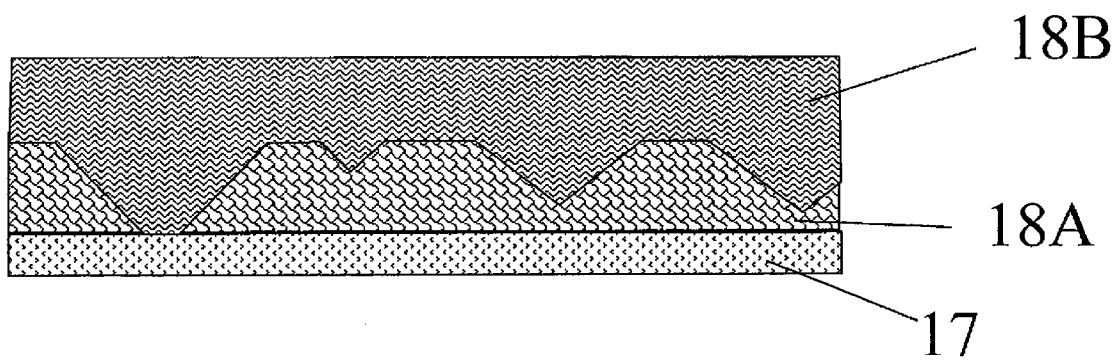
FIG. 13 A schematic cross-sectional view of a gate electrode, showing a reaction of Ni silicide.

Without being limited to TiSi$_2$, the silicide upper layer 18B may be made of a metal silicide containing other metals such as Ni, Pt, or W. However, according to an experiment by the inventors, when forming silicide from Ni, the reaction will have a uniform progress in the depth direction if NiSi is formed, but the reaction will have a non-uniform progress in the depth direction if $NiSi_2$ is formed. Consequently, as shown in FIG. 13, the interface between the silicon layer 18A and the silicide upper layer 18B will form upside-down triangle shapes toward the gate insulating film 17, and some of their apices may reach the gate insulating film 17. In this case, the gate insulating film 17 will have a reliability problem, and also the threshold value of the MOS transistor will be non-uniform due to different work functions. On the other hand, $TiSi_2$ is stable in a relatively broad temperature range, and therefore a uniform silicide film can be formed in the depth direction, thus being more advantageous than other metals.

An interlayer insulating film 19 mainly insulates the gate electrode 18 from an upper wiring electrode 1bs described later. It has a film thickness of about 1 micron.

A source electrode 1as is an electrode which is in ohmic contact with the source region 14. The source electrode 1as is formed by effecting a silicidation reaction between Ni and SiC, for example. Note that the silicide may be formed by using a metal other than Ni instead of Ni, or using another metal in addition to Ni. It is desirable that the source electrode 1as is also in ohmic contact with the contact implanted region 15.

An electrode 1ag is an electrode which is in ohmic contact with the gate electrode 18, and is formed by silicidizing Ni, similarly to the source electrode 1as. However, the electrode 1ag does not need to be identical with the source electrode 1as.

The upper wiring electrode 1bs connects, in parallel, a plurality of source electrodes 1as which are included in one vertical MOSFET. The upper wiring electrode 1bs is made of aluminum, for example, and has a thickness of about 3 microns. Similarly, a gate pad electrode 1bg is formed so as to be in contact with the electrode 1ag. The gate pad electrode 1bg may typically be made of the same material as the upper wiring electrode 1bs. A passivation film 1c is located in the periphery of the semiconductor device 10, and fills between the upper wiring electrode 1bs and the gate pad electrode 1bg, for example.

A rear-face ohmic electrode layer 1f is formed on the rear face of the silicon carbide substrate 11. The rear-face ohmic electrode layer 1f in the present embodiment contains titanium, and is silicidized at the side where it is in contact with the silicon carbide substrate 11. The rear-face ohmic electrode layer 1f has a thickness of about 150 nm, for example, and its surface (the side farther away from the silicon carbide substrate) is preferably nitrided. One example of the rear-face ohmic electrode layer 1f is a Ti/Ni/Ag multilayer electrode, for example.

Embodiment 2

Next, with reference to FIG. 2 to FIG. 8, an embodiment of a method of producing the silicon carbide semiconductor device according to the present invention will be described.

First, as shown in FIG. 2(a), a silicon carbide substrate 11 having a semiconductor layer 12 on its surface is provided. A buffer layer 12b (an $n^+$ type semiconductor layer, which herein is a silicon carbide layer) having a thickness of about 0.5 to 4 microns may be formed at the interface between the silicon carbide substrate 11 and the semiconductor layer 12. The concentration of the buffer layer is set to about $1 \times 10^{16}$ to $1 \times 10^{19}$ cm$^{-3}$.

As shown in FIG. 2(b), after forming a mask 21 on the surface of the semiconductor layer 12, aluminum is implanted in regions of the semiconductor layer 12 that are not covered by the mask 21, thereby forming p type well regions 13. Openings defining the shapes and positions of the p type well regions 13 are formed in the mask 21. After the implantation step, the mask 21 is removed.

After forming a mask 22 on the semiconductor layer 12 as shown in FIG. 2(c), nitrogen is implanted in regions of the semiconductor layer 12 that are not covered by the mask 22, thereby forming $n^+$ type source regions 14. Openings defining the shapes and positions of the source regions 14 are formed in the mask 22. After the implantation step, the mask 22 is removed.

As shown in FIG. 3(a), a mask 23 is formed on the semiconductor layer 12, and aluminum is implanted in regions of the semiconductor layer 12 that are not covered by the mask 23, thereby forming $p^+$ type contact implanted regions 15. Each $p^+$ type contact implanted region 15 is located in a central portion of a source region 14, and is formed so as to reach the p type well 13 from the surface of the semiconductor layer 12. Openings defining the shapes and positions of the $p^+$ type contact implanted regions 15 are formed in the mask 23. After the implantation step, the mask 23 is removed.

Next, after depositing a carbon type thin film (not shown) on the semiconductor layer 12, a heating is conducted in an inert gas ambient for about 30 minutes, at a temperature of about 1700° C. Through this heat treatment, the impurities which have been implanted in the semiconductor layer 12 are activated. Thereafter, by removing the carbon type thin film, as shown in FIG. 3(b), the silicon carbide substrate 11 is obtained, whose semiconductor layer 12 includes the p type well regions 13, the $n^+$ type source regions 14, and the $p^+$ type contact implanted regions 15 formed therein as impurity implanted regions.

Next, after forming a channel layer 16 made of silicon carbide on the semiconductor layer 12 having the impurity implanted regions, as shown in FIG. 3(c), portions of the channel layer 16 are dry-etched so that each contact implanted region 15 and a portion of each source region 14 are exposed. The planar layout of the channel layer 16 is similar to the planar layout of the gate electrode 108 shown in FIG. 12B, such that the channel layer 16 includes a plurality of openings each located above a source region 14.

By heating the semiconductor layer 12 having the channel layer 16 in an oxygen-containing ambient at about 1200° C. to oxidize the semiconductor layer 12, a gate insulating film 17 is formed on the channel layer 16 as shown in FIG. 4(a). After this oxidation treatment, a heat treatment may be performed in a gas ambient containing nitrogen atoms, thereby performing a nitridation treatment for the gate insulating film 17. Instead of being formed through a thermal oxidation step, the gate insulating film 17 may be formed by depositing an insulating layer such as an $SiO_2$ layer, for example. Moreover, a gate insulating film 17 which has an insulating layer on a thermal oxidation layer may be formed by sequentially performing a thermal oxidation step and an insulating film depositing step.

Next, a silicon film is deposited on the gate insulating film 17. For example, $n^+$ type polysilicon (thickness about 500 nm) which is doped with phosphine is deposited. Thereafter, through lithography and etching steps, this polysilicon is patterned into a gate electrode shape as shown in FIG. 4(b), thus forming a silicon gate electrode 180.

Next, as shown in FIG. 4(c), an insulating film 30 is deposited on the front face side of the silicon carbide substrate 11, so as to cover the silicon gate electrode 180. Although the insulating film 30 in the present embodiment is made of an $SiO_2$ film (PSG film) containing phosphorus, it may be made of other insulating materials. The insulating film 30 is suitably formed by a thin film deposition technique having a high ability to cover level differences (e.g. CVD technique), and the upper face and the side faces of the silicon gate electrode 180 are covered by the insulating film 30. Within the insulating film 30, portions adjoining the side faces of the silicon gate electrode 180 have an effective thickness (size along the direction perpendicular to the substrate surface) which is greater than those of the other portions. The thickness of the insulating film 30 may preferably be set to a range from 500 nm to 2 µm.

Next, as shown in FIG. 5(a) and FIG. 5(b), the insulating film 30 is etched back by anisotropic dry etching technique, whereby side wall spacers 31 are formed on the side faces of the silicon gate electrode 180, the side wall spacers 31 being composed of portions of the insulating film 30. The arrows in FIG. 5(a) show the direction of an etching which progresses anisotropically. Since this etch back step is performed without using a photomask, no mask alignment is required in the photolithography step, and the side wall spacers 31 will be formed in a self-aligning manner with respect to the side faces of the silicon gate electrode 180. The thickness (the size along a direction which is parallel to the substrate principal face) of the side wall spacers 31 shown in FIG. 5(b) is substantially equal to the thickness of the insulating film 30 when it has just been deposited. By adjusting the deposition rate and the deposition time, the thickness of the insulating film 30 can be controlled with a high precision, and therefore the thickness of the side wall spacers 31 can also be controlled with a high precision.

Although the figures are illustrated so that the gate insulating film 17 remains above the source regions 14 even after the etch back of the insulating film 30 is finished, it would also be possible to remove the gate insulating film 17 from the source regions 14. When the gate insulating film 17 and the insulating film 30 are made of $SiO_2$, it is difficult to selectively etch the insulating film 30; therefore, when the etch back of the insulating film 30 is completed, the portions of the gate insulating film 17 that are located above the source regions 14 will also have been removed, thus leaving portions of the source regions 14 exposed. If any insulating film 30 remains on the upper face of the silicon gate electrode 180, silicidation cannot be achieved, and therefore it is preferable to perform the etch back of the insulating film 30 under overetching conditions. Under overetching conditions, it is easy to completely remove the gate insulating film 17 above the source regions 14.

Next, as shown in FIG. 5(c), Ti is deposited as a first metal 32. For example, the thickness of Ti is set within the range from 50 nm to 200 nm, e.g. 100 nm. Thereafter, by performing a heat treatment at a temperature from 650° C. to 850° C., as shown in FIG. 6(a), an upper portion of the silicon gate electrode 180 is silicidized, whereby a silicide upper layer 18B of metal silicide is formed. On the other hand, a lower portion of the silicon gate electrode 180 is not silicidized, but remains as silicon. In the case where the silicon gate electrode 180 is made of amorphous silicon, the amorphous silicon will crystallize and change into polysilicon because of the heat treatment for silicidation. The gate electrode 18 having the silicon lower layer 18A of polysilicon and the silicide upper layer 18B of metal silicide is formed in this manner.

What is important in the present embodiment is to select as the first metal 32 a metal which will easily undergo a silicidation reaction with silicon but which is unlikely to react with SiC. Since the side wall spacers 31 are formed in a self-aligning manner with respect to the side faces of the silicon gate electrode 180, the surface of the source regions 14 is not necessarily covered by the insulating film 30 when the first metal 32 is deposited. Therefore, the first metal 32 may be in contact not only with the upper face of the silicon gate electrode 180 but also with the surface of the semiconductor layer 12, which is made of SiC. When performing a heat treatment for silicidation, if the first metal 32 is silicidized above the source regions 14, $TiSi_2$ will be formed in the source regions 14. However, in the present embodiment, $TiSi_2$ does not form in the source regions 14, but another metal silicide is subsequently formed, thereby improving the contact characteristics.

Figure 11:
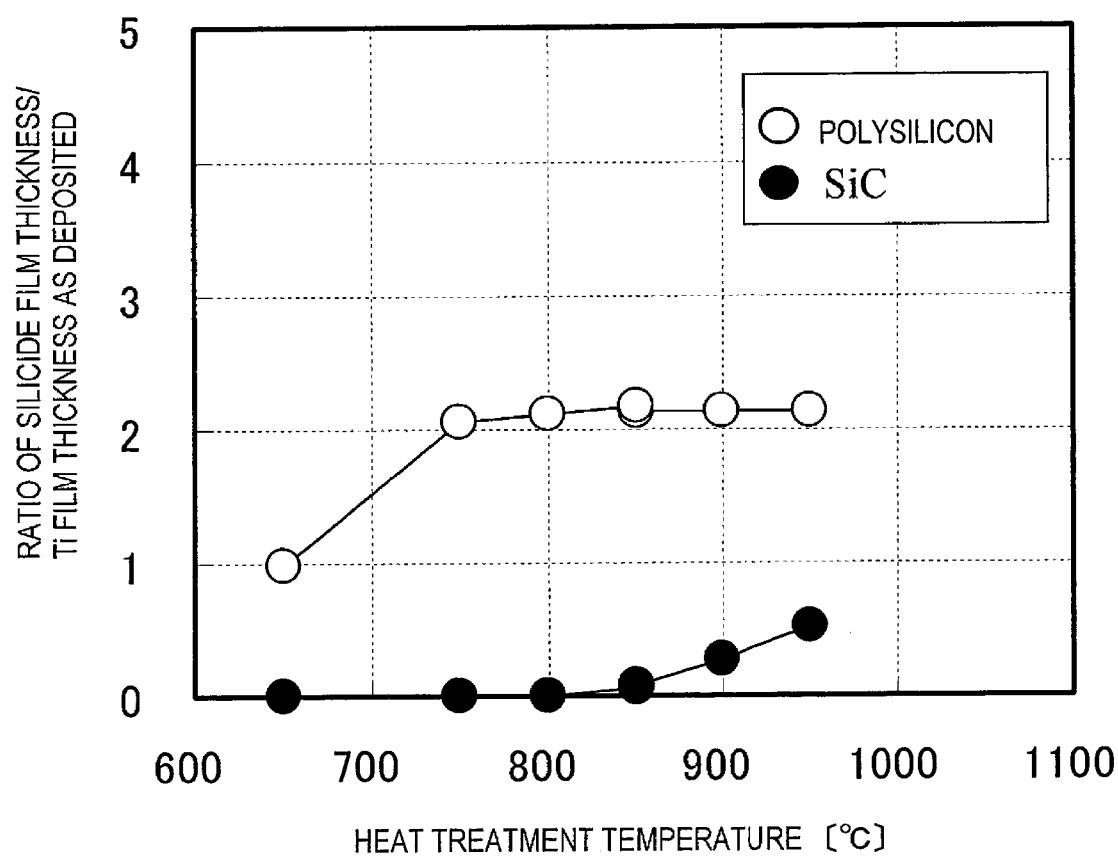
FIG. 11 A graph showing a heat treatment temperature dependence of the amount of Ti silicidation reaction.

FIG. 11 is a graph showing the heat treatment temperature dependence of a ratio of the film thickness of Ti silicide to the film thickness of Ti immediately after deposition (as-deposited). The vertical axis of the graph represents a ratio obtained by dividing the silicide film thickness by the film thickness of Ti as deposited (ratio of silicide film thickness/Ti film thickness as deposited), whereas the horizontal axis represents the heat treatment temperature. The graph of FIG. 11 shows two kinds of data, i.e., that of the case where the underlayer of Ti is polysilicon and that of the case where it is SiC. In the case where the underlayer of Ti is polysilicon, the ratio is 1 when the heat treatment temperature is 650° C., and this ratio is further increased at heat treatment temperatures higher than 650° C. This means that a silicidation reaction with polysilicon is occurring even when the heat treatment temperature is 650° C., which is relatively low. Thus, it can be seen that silicon easily undergoes a silicidation reaction with Ti at temperature of 650° C. or above.

On the other hand, in the case where the underlayer is SiC, the ratio of silicide film thickness/Ti film thickness as deposited is about 0 at a heat treatment temperature of 850° C. This means that no silicidation reaction is occurring at 850° C., and the reaction begins to occur beyond 850° C. Thus, it can be seen that SiC does not react with Ti at 850° C. or below.

In the present embodiment, based on the above experimental results, only the upper portion of the gate electrode 18 can be selectively silicidized by adjusting the heat treatment temperature for silicidation to be in the range from 650° C. to 850° C.

On silicon, $TiSi_2$ will be formed to a thickness which is twice as large as the thickness of the Ti film that has been deposited. Therefore, in order to prevent silicide from coming into contact with the gate insulating film 17, it is desirable that the film thickness of the deposited Ti is thinner than ½ of the thickness of the silicon gate electrode.

Next, as shown in FIG. 6(b), the unreacted first metal 32 which remains on the source regions 14 is removed. Thereafter, as shown in FIG. 6(c), an interlayer insulating film 19 is deposited. As the interlayer insulating film 19, an $SiO_2$ film (PSG film) containing phosphorus can be selected, but other insulating films can also be selected.

Next, as shown in FIG. 7(a), a plurality of contact holes are formed in the interlayer insulating film 19 and the gate insulating film 17, thus exposing the contact implanted regions 15 and portions of the source regions 14 in the semiconductor layer 12. As the contact holes are formed, the contact implanted regions 15 and portions of the source regions 14 are exposed, and also portions of the silicide upper layer 18B are exposed. Thus, as shown in FIG. 7(a), exposed faces 41 of the semiconductor layer 12 and an exposed face 42 of the silicide upper layer are formed.

Next, a second metal (not shown) which is in contact with at least a portion of each exposed face 41 is deposited in the interlayer insulating film 19. The second metal may be about 50 to 200 nm of Ni, for example, and a metal material is to be selected which silicidizes with silicon carbide to form a low-resistance ohmic contact.

Figure 7:
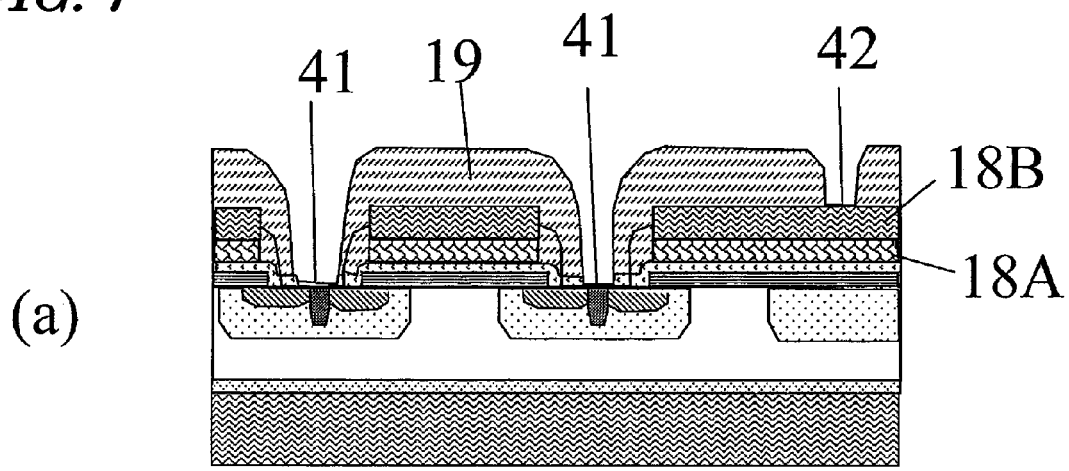
FIG. 7 (a) to (c) are cross-sectional views showing production steps of the semiconductor device according to Embodiment 2.
Figure 7:
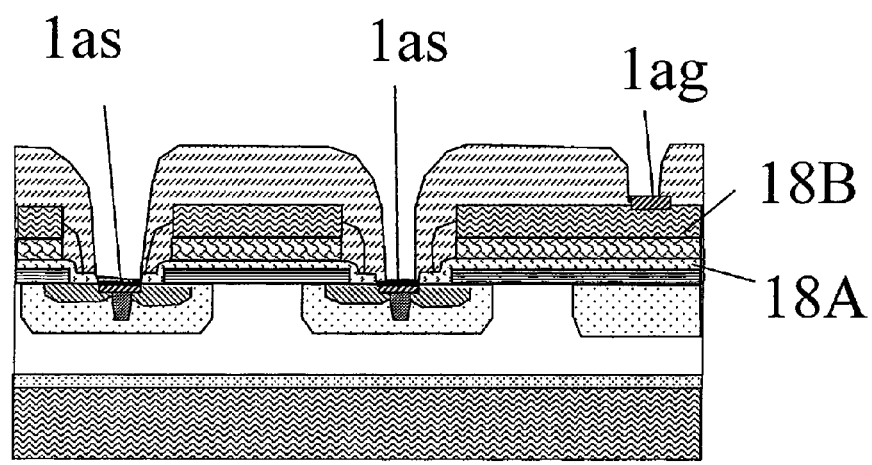
Figure 7:
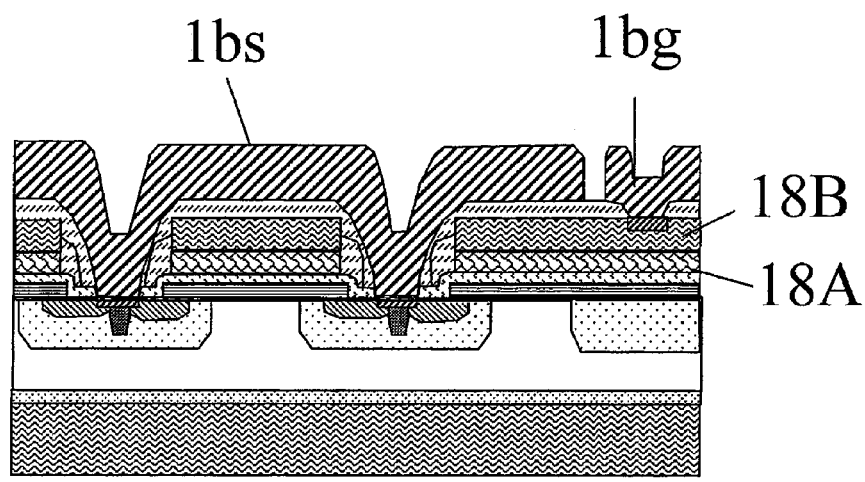

By performing a heat treatment at about 800 to 1100° C. after deposition of the second metal, the interface between the second metal and the semiconductor layer 12 is silicidized. Thus, source electrodes 1*as* shown in FIG. 7(*b*) are formed. At this time, on the exposed face 42, an electrode 1*ag* which is in ohmic contact with the gate electrode 18 (silicide upper layer 18B) is also simultaneously formed, as shown in FIG. 7(*b*). Since the silicide upper layer 18B completely reacted during the previous heat treatment for silicidation, it does not change through this step.

SiC has a broad band gap, and thus it is relatively difficult for SiC to form an ohmic contact. In particular, contact with a p$^+$ layer is very difficult in the case where Ti is used. On the other hand, Ni can relatively easily form ohmic contacts with a p$^+$ layer and an n$^+$ layer. Therefore, as the silicide film for forming ohmic contacts, it is desirable to form a silicide film which is different from the silicide of the gate electrode 18.

Thereafter, as shown in FIG. 7(*c*), a metal (e.g. aluminum) to become an upper wiring electrode is deposited on the front face side (the side having the interlayer insulating film 19) of the substrate 11, and is patterned. Thus, a source pad 1*bs* and a gate pad 1*bg* are formed. Next, as shown in FIG. 8(*a*), a passivation film 1*c* is deposited on the side having the source pad 1*bs* and the gate pad 1*bg*, and thereafter the passivation film 1*c* is locally etched so as to cover each pad 1*bs*, 1*bg* while exposing a portion of the pad surface.

Figure 8:
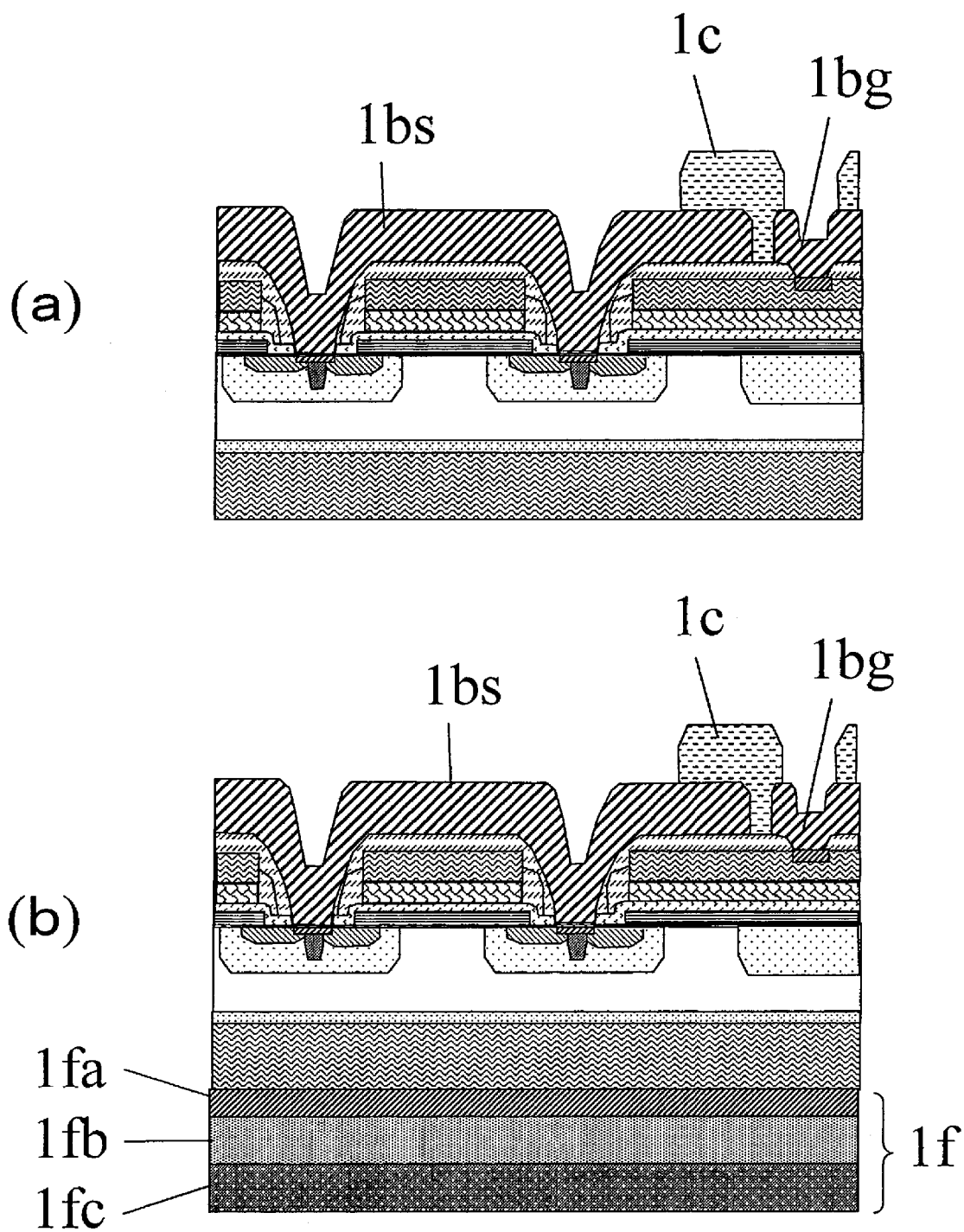
FIG. 8 (a) and (b) are cross-sectional views showing production steps of the semiconductor device according to Embodiment 2.

Finally, as shown in FIG. 8(*b*), a metal electrode layer 1*f* is deposited on the rear face side of the substrate 11, and the semiconductor device 10 is completed. In the example shown in FIG. 8(*b*), a multilayer structure of a Ti layer 1*fa*, an Ni layer 1*fb*, and an Ag layer 1*fc* is used as the metal electrode layer 1*f*. The layer structure of the metal electrode layer 1*f* is to be appropriately selected according to the packaging of the semiconductor device 10. Other examples of the metal electrode layer 1*f* may be a Ti/Ni/Au layer, a Cr/NiCr/Ni/Ag layer, or of course any other combination.

Embodiment 3

Hereinafter, with reference to FIG. 9 and FIG. 10, another embodiment of the method of producing the silicon carbide semiconductor device according to the present invention will be described.

The production steps according to the present embodiment are identical to the steps in Embodiment 2 as described with reference to FIG. 1 to FIG. 4(*c*), and the descriptions thereof are omitted.

Figure 9:
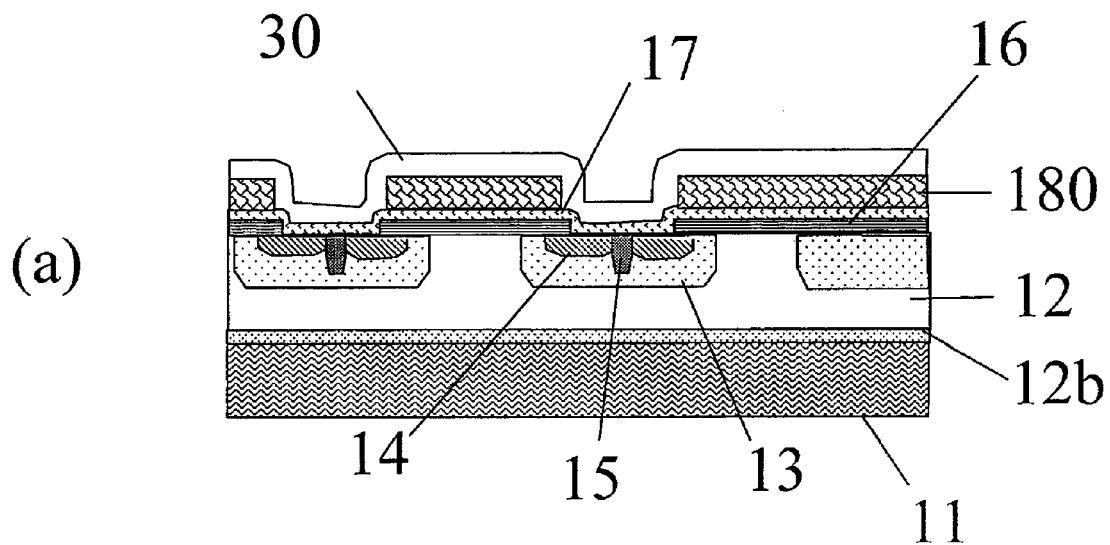
FIG. 9 (a) to (c) are cross-sectional views showing production steps of a semiconductor device according to Embodiment 3.
Figure 9:
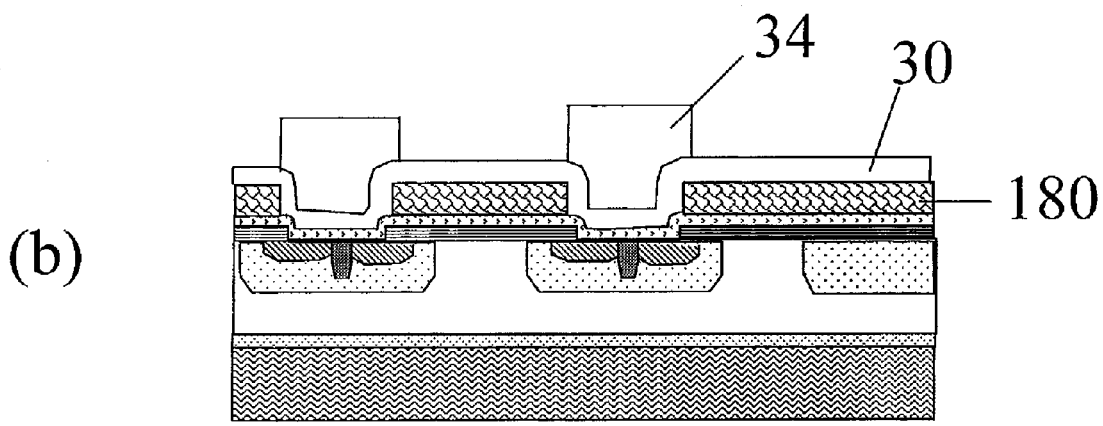
Figure 9:
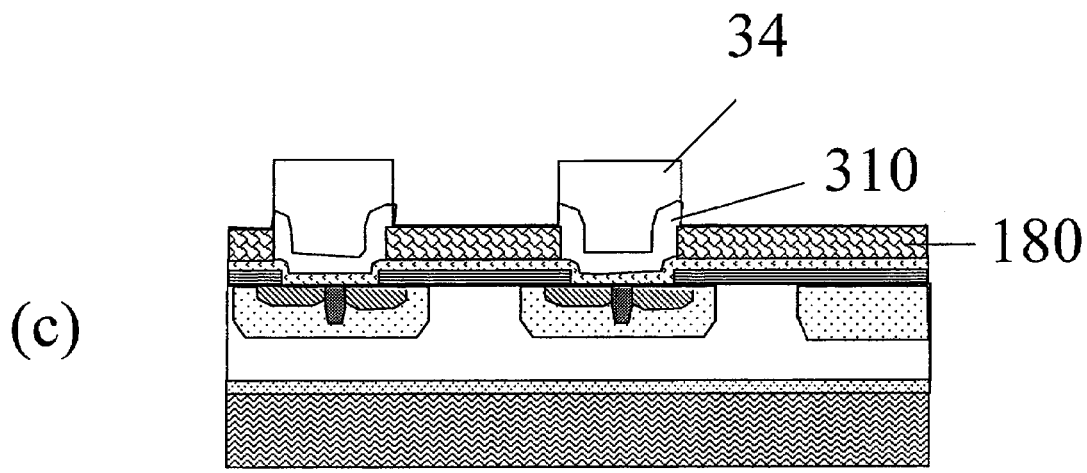

After obtaining the structure shown in FIG. 9(*a*) through the above-described steps, in the present embodiment, a mask 34 having openings for exposing only the upper face of the silicon gate electrode 180 is formed, as shown in FIG. 9(*b*). The mask 34 is typically a resist mask, and is suitably formed through a photolithography step. Proper positioning of the mask (mask alignment) is necessary so that the openings of the mask 34 are located in the upper face of the silicon gate electrode 180. Since it is necessary that the openings of the mask 34 will surely fit within the upper face of the silicon gate electrode 180 even if a misalignment occurs, the diameter of each opening of the mask 34 is designed to be smaller than the width of the silicon gate electrode 180.

Next, as shown in FIG. 9(*c*), portions of the insulating film 30 that are not covered by the mask 34 are removed, thereby exposing the upper face of the silicon gate electrode 180. At this time, an insulating layer 310 is formed in the portions of the mask 34 that are covered by the insulating film 30. The insulating layer 310 covers not only the side faces of the silicon gate electrode 180 but also the upper faces of the source regions 14.

Figure 10:
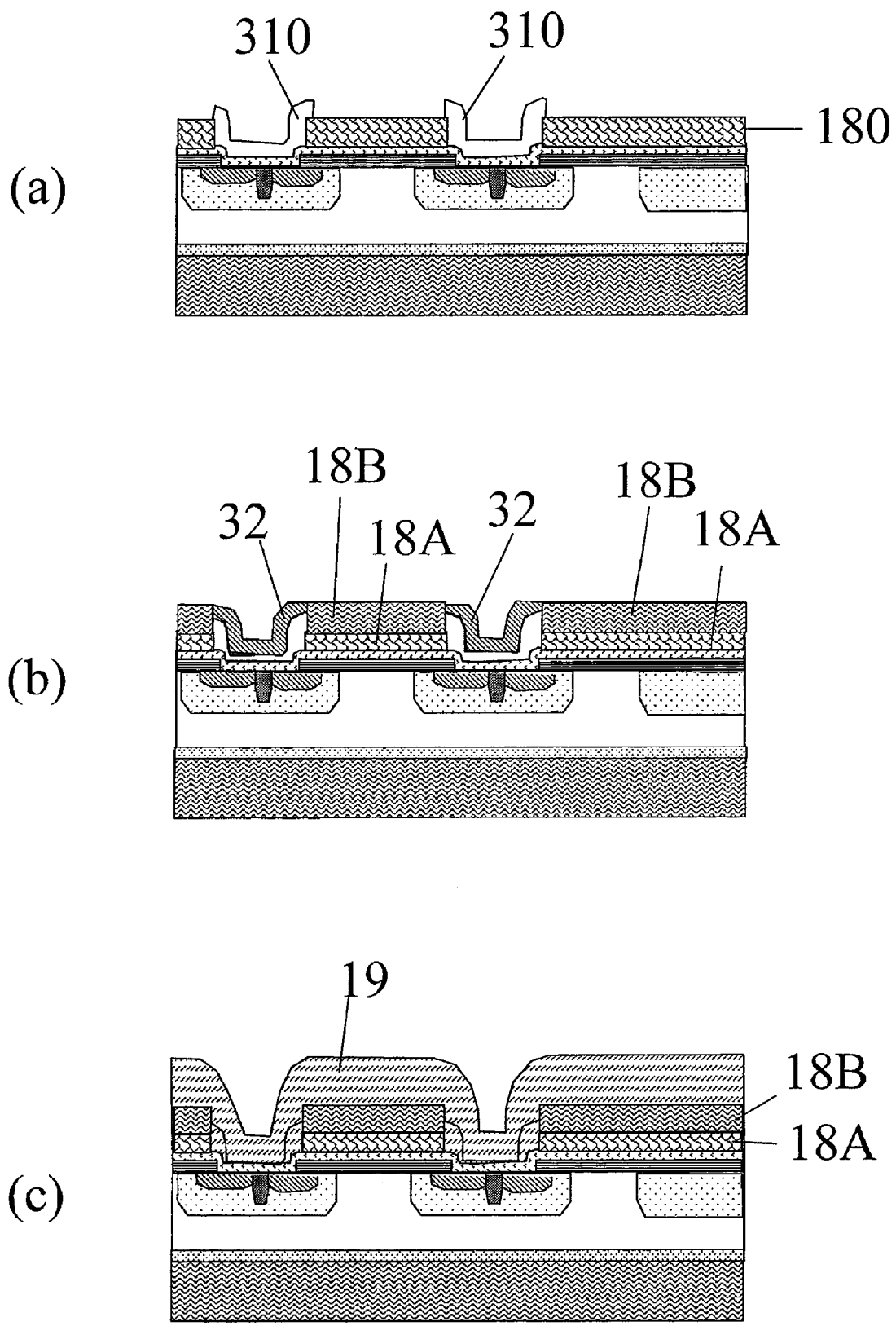
FIG. 10 (a) to (c) are cross-sectional views showing production steps of the semiconductor device according to Embodiment 3.

Next, the mask 34 is removed as shown in FIG. 10(*a*). Thereafter, Ti with a thickness of 50 to 200 nm (not shown) is deposited as a first metal. Herein, after depositing Ti to a thickness of 100 nm, a heat treatment is performed at a temperature from 650° C. to 850° C., thereby forming a silicon lower layer 18A of polysilicon and a silicide upper layer 18B of silicide as shown in FIG. 10(*b*).

In the present embodiment, the insulating layer 310 not only covers the side faces of the silicon gate electrode 180 but also the upper faces of the source regions 14, so that the first metal 32 is not in contact with the source regions 14. Therefore, it is possible to effect silicidation of the gate electrode under conditions where the first metal 32 and the silicon carbide will react to form silicide. As a result, when Ti is used as the first metal 32, for example, the temperature of the heat treatment for silicidation may be set to a value of 850° C. or above.

After silicidation, the unreacted first metal 32 remains on the insulating layer 310 as shown in FIG. 10(*b*). After removing the unreacted first metal 32, an interlayer insulating film 19 shown in FIG. 10(*c*) is formed. Herein, an SiO$_2$ film (PSG film) containing phosphorus may be selected, but other insulating films can also be selected.

The subsequent steps are identical to the steps described in Embodiment 1 with reference to FIG. 7(*a*) to FIG. 8(*b*), and the descriptions thereof are omitted.

Note that the semiconductor device construction according to the present embodiment is not limited to the above construction. Although the channel layer 16 of silicon carbide is formed on the semiconductor layer 12 in the above embodiments, the channel layer 16 may be omitted. In such a structure lacking the channel layer 16, it is possible to form a channel by inverting the conductivity type of the drift region portion under the gate electrode with a voltage applied to the gate electrode 18.

Although the present embodiment has been illustrated based on a double implanted MOSFET (DIMOSFET), it may be other device forms, such as a trench MOSFET or an IGBT.

INDUSTRIAL APPLICABILITY

According to the present invention, metal silicide is not in contact with a gate insulating film, so that the sheet resistance of a gate electrode can be reduced. As a result, the delay due to gate resistance can be decreased. Thus, applications are possible for semiconductor devices having a gate electrode on a silicon carbide substrate, e.g., an MOSFET.

The invention claimed is:

1. A method of producing a silicon carbide semiconductor device, comprising the steps of:
   providing a silicon carbide substrate having a silicon carbide epitaxial layer formed on a surface thereof;
   forming a source region in the silicon carbide epitaxial layer;
   forming a gate insulating film on the silicon carbide epitaxial layer;
   forming a silicon gate electrode on the gate insulating film;
   covering side faces of the silicon gate electrode with an insulator;
   depositing a first metal which is in contact with an upper face of the silicon gate electrode;
   allowing a portion of the silicon gate electrode to react with the first metal to form a gate electrode having an upper layer of first metal silicide and a lower layer of silicon;

removing an unreacted portion of the first metal having failed to react with the silicon gate electrode;

forming an interlayer insulating film having an opening above the source region;

depositing on the interlayer insulating film a second metal which is in contact with a portion of the source region via the opening; and allowing a portion of the source region to react with the second metal to form a layer of second metal silicide above the source region, wherein, the step of covering the side faces of the silicon gate electrode with an insulator comprises the steps of:

depositing an insulating film; and etching back the insulating film to form side wall spacers on the side faces of the silicon gate electrode, and, when the portion of the silicon gate electrode and the first metal are allowed to react, the portion of the first metal is in contact with the source region.

2. The method of producing a silicon carbide semiconductor device of claim 1, wherein, when the portion of the silicon gate electrode and the first metal are allowed to react, the first metal is heated at a temperature which allows silicidation to occur between the first metal and silicon but which does not allow silicidation to occur between the first metal and silicon carbide.

3. The method of producing a silicon carbide semiconductor device of claim 2, wherein, the first metal is Ti; and the temperature is in a range from 650° C. to 850° C.

4. The method of producing a silicon carbide semiconductor device of claim 1, wherein, the step of covering the side faces of the silicon gate electrode with an insulator comprises the steps of:

depositing an insulating film; and exposing at least a portion of the upper face of the silicon gate electrode by removing at least part of a portion of the insulating film which is in contact with the upper face of the silicon gate electrode.

5. The method of producing a silicon carbide semiconductor device of claim 4, wherein, when the portion of the silicon gate electrode and the first metal are allowed to react, the first insulating film is present between the first metal and the source region.

6. The method of producing a silicon carbide semiconductor device of claim 1, wherein the second metal contains Ni.

7. The method of producing a silicon carbide semiconductor device of claim 1, wherein the first metal has a thickness which is smaller than ½ of a thickness of the silicon gate electrode.

* * * * *